United States Patent [19]
Little et al.

[11] Patent Number: 5,260,621
[45] Date of Patent: Nov. 9, 1993

[54] HIGH ENERGY DENSITY NUCLIDE-EMITTER, VOLTAIC-JUNCTION BATTERY

[75] Inventors: Roger G. Little, Bedford; Edward A. Burke, Woburn, both of Mass.

[73] Assignee: Spire Corporation, Bedford, Mass.

[21] Appl. No.: 672,879

[22] Filed: Mar. 18, 1991

[51] Int. Cl.$^5$ .................. G21H 1/00; H01L 31/06; H01L 21/20
[52] U.S. Cl. .................. 310/303; 425/5; 136/202; 136/253
[58] Field of Search .................. 310/303; 429/5; 136/202, 253

[56] References Cited

U.S. PATENT DOCUMENTS

| | | | |
|---|---|---|---|
| 3,677,825 | 7/1972 | Cathey | 136/202 |
| 4,097,654 | 6/1978 | Guazzoni | 429/5 |
| 4,591,654 | 5/1986 | Yamaguchi et al. | 136/252 |
| 4,681,983 | 7/1987 | Markvart et al. | 136/253 |

OTHER PUBLICATIONS

Search of "Betavoltaic" For Edward Burke of Spire Corporation dated Nov. 30, 1990.
C. J. Keavney, V. E. Haven, S. M. Vernon "Emitter Structures in MOCVDINP Solar Cells" *21st IEEE PVSC* May, 1990.
"Neutron Damage in Indium Phosphide" May 4, 1990 Edward A. Burke.
Y. Suzuki, Y. Fukada, Y. Nagashima "An Indium Phosphide Solid State Detector A Possible Low energy gamma and Neutrino Detector" *Nucl. Inst. and Meth. In Phys. Res.* A275 (1989) 142–148.
Masafumi Yamaguchi and Koushi Ando "Mechanism for Radiation Resistance of InP Solar Cells" *J. Appl. Phys.* 63(11) Jun. 1, 1988, pp. 5555–5562.
I. Weinberg, C. K. Swartz and R. E. Hart, Jr. "Progress In Indium Phosphide Solar Cell Research" Ninth Space Photovoltaic Research and Technology Conference Apr. 19–21, 1988 pp. 17–26.
Pearsall, Goodbody, Oparaku, Dollery and Hill "Effect of Isotropic Proton Irradiation on the Performance of ITO/InP Solar Cells" 20th IEEE Photovoltaic Specialist Conference vol. II, pp. 898–902.
Coutts and Yamaguchi, "Indium Phosphide-Based Solar Cells: A Critical Review of their Fabrication, Performance and Operation" *Current Topics In Photovoltaics* vol. 3.
Yamaguchi, Hayashi, Ushirokawa, Takahashi, Koubata, Hashimoto, Okazaki, Takamoto, Ura, Ohmori; Ikegami, Arai, Orii "First Space Flight of InP Solar Cells" 21st IEEE PVSC pp. 1198–1202.
Chandra Goradia and James V. Geier, Weinberg "Modelling and Design of High Efficiency Radiation Tolerant Indium Phosphide Space Solar IEEE Cells" 1987 pp. 937–943.
Yamaguchi, Itoh, Ando, Yamamoto "Room-Temperature Annealing Effects on Radiation-Induced Defects in InP Crystals and Solar Cells" *Jap. Journal of App. Phys.* vol. 25, No. 11, Nov. 1986 pp. 1650–1656.
Weinberg, Swartz, Hart, Jr., Yamaguchi "Radiation Damage in Protein Irradiated Indium Phosphide Solar Cells" NASA Technical Memorandum 88835 pp. 1–10 1986.

(List continued on next page.)

*Primary Examiner*—Nelson Moskowitz
*Attorney, Agent, or Firm*—Morse, Altman, Dacey & Benson

[57] ABSTRACT

An electric battery comprises a semiconductor junction incorporating an inorganic crystalline compound of Group III and Group V elements of the Periodic Table characterized by a predetermined annealing temperature for defects therein; a nuclear source of relatively high energy radiation and concomitant heat, which radiation causes generation of such defects in the semiconductor junction; and a thermal impedance enclosure for the nuclear source and the semiconductor-junction for retaining therewithin a sufficient quantity of heat to maintain a functional relationship between the generation of defects and the predetermined annealing temperature during operation.

19 Claims, 2 Drawing Sheets

OTHER PUBLICATIONS

Weinberg, Swartz, Hart, Jr. "Potential For Use of InP Solar Cells in the Space Radiation Environment" 18th IEEE Photovoltaic Specialist Conference Oct. 21, 1985–Oct. 25, 1985 pp. 1722–1724.

Yamaguchi, Yoshio Itoh, Ando "Room–Temperature Annealing of Radiation–Induced Defects In InP Solar Cells" App. Phys. Lett. 45(11) Dec. 1, 1984 pp. 1206–1208.

Yamaguchi, Uemura, Yamamoto "Radiation Damage in InP Single Crystals and Solar Cells" J. App. Phys. 55(6) Mar. 15, 1984 pp. 1424–1436.

Yamaguchi, Ando, Yamamoto, Uemura "Minority–Carrier Injection Annealing of Electron Irradiation–Induced Defects In InP Solar Cells" App. Phys. Lett. (44) (4) Feb. 15, 1984 pp. 432–434.

Manasse, Pinajian, Tse "Schottky Barrier Betavoltaic Battery" IEEE Transactions on Nuclear Science vol. NS-23 No. 1, Feb. 1976 pp. 860–870.

Wei "Parametric Studies and Optimization of the Beta-voltaic Cell–II Open–Circuit Voltage and Power Efficiencies" Solid State Electronics 1975 vol. 18 pp. 71–77.

Gasper and Fester "Cardiac Pacemaker Power Sources" Proc. Intersociety Energy Conversion Engineering Conference 1975 pp. 1205–1213.

Wei "Parametric Studies and Optimization of the Beta--Voltaic Cell–I, Short–Circuit Current." Solid State Electronics 1974 vol. 17, pp. 1091–1098.

Wei "Optimization of the Beta-Voltaic Cell" 9th Intersociety Energy Conversion Engineering Conference Proceedings 1974 pp. 719–725.

Olsen "Advanced Betavoltaic Power Sources" 9th Intersociety Energy Conversion Engineering Conference Proceedings 1974 pp. 754–762.

Olsen, "Beta Irradiation of Silicon Junction Devices: Effects on Diffusion Length", IEEE Trans. Nucl. Sci. MS-19 Dec. 1972, pp. 375–381.

Hilsum and Rose–Innes *Semiconducting III-V Compounds* 1961 pp. 1–4, 68–88, 196–220.

HIGH ENERGY DENSITY NUCLIDE-EMITTER, VOLTAIC-JUNCTION BATTERY

FIELD OF THE INVENTION

The present invention relates to radio-nuclide, voltaic-junction batteries, and, more particularly, to compact electric batteries that are powered by the combination of a nuclear radiation emitting source and a responsive semiconductor voltaic junction for service in many applications where chemical batteries are unsatisfactory or inferior.

THE PRIOR ART

Compact long-life energy sources have wide applications in such fields as aerospace systems, cardiac pacemakers, computer memory maintenance, remote instrumentation, etc. Chemical batteries suffer generally from theoretical limits in the energy density, they can accommodate. Radio-nuclide, voltaic-junction cells have much higher theoretical limits in energy density, in some cases more than a factor of 1000 greater, but, in the past, have not achieved desirable high energy density and long life in practice. A major problem in such prior art cells has been the limited ability of semiconductor junctions to withstand high energy alpha or beta emission without damage during operation.

Silicon p-n junction cells for directly converting radiation, either visible or ionizing, to electricity were developed in the early 1950's. Specific use of radio-isotopes to power silicon p-n cells, known as betavoltaic cells, were extensively studied in the 1970's for applications where low power but high energy density were important, for example, in cardiac pacemakers. A primary motivation for these studies was that the theoretical energy density is much higher in betavoltaic cells than in the best chemical batteries, 24.3 W-h/cm$^3$ versus 0.55 W-h/cm$^3$ for mercury-zinc batteries. Unfortunately, isotopes that could be employed with silicon had to be limited to low energy beta emitters because of radiation damage. For example, threshold energy for electron damage is about 0.180 MeV assuming an atomic displacement damage threshold of 12.9 eV. Alpha particles cause so much damage that they were not seriously considered at any energy. This constraint excluded the most potent nuclide sources, and thus restricted maximum power of such devices because of limits to the specific activity achievable at maximum concentration with reasonable half-lives.

BRIEF DESCRIPTION OF THE INVENTION

The primary object of the present invention is to provide a novel high energy density electric cell comprising a nuclear source of relatively high energy radiation and concomitant heat, a semiconductor junction incorporating an inorganic crystalline compound of Group III and Group V elements characterized by defect generation in response to the nuclear source, and an enclosure having a sufficiently high thermal impedance to retain therewithin a sufficient quantity of the heat generated by the nuclear source for maintenance of the semiconductor junction above a predeterminedly high annealing temperature during operation. The nuclear radiation includes energetic radiation such as alpha, beta and gamma emissions or combinations thereof. The semiconductor junction, for example, includes compounds of indium and phosphorous differentially treated with n or p dopants. The thermal impedance is composed of a thermal insulator such as a ceramic electrical non-conductor. The arrangement is such that damage to the semiconductor junction resulting from the highly energetic emissions from the nuclear source is repaired by annealing in real time at the predetermined temperature maintained within the insulating enclosure.

Other objects of the present invention will in part be obvious and will in part appear hereinafter.

For a fuller understanding of the nature and objects of the present invention, reference is made to the following specification, which is to be taken in connection with the accompanying drawings, wherein.

DETAILED DESCRIPTION OF THE PREFERRED EMBODIMENT

Figure 1:
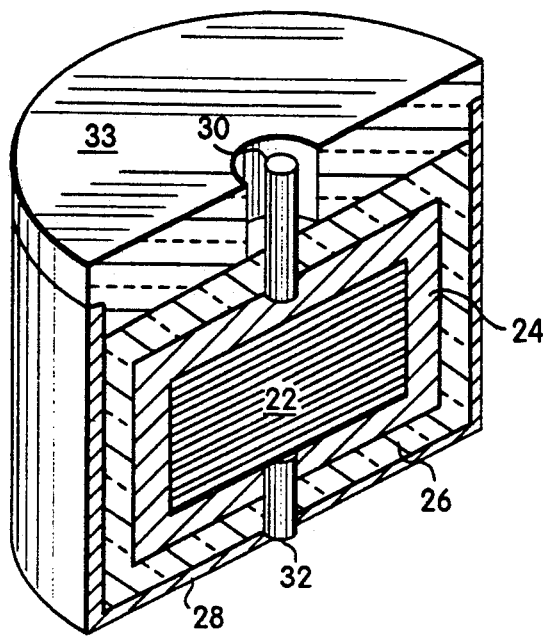
FIG. 1 is an exaggerated cut-away view of a nuclear battery embodying the present invention.

A preferred embodiment of the present invention is shown in FIG. 1 as comprising a stack 22 of alternate emitting nuclide and semiconductor-junction strata, an inner heavy metal shield 24 that absorbs nuclear radiation escaping from stack 22, an intermediate high thermal impedance housing 26 that retards heat transfer from within stack 22, and an external metal casing 28 that snugly receives housing 26. The electrical output of stack 22 is established across a positive terminal 30 and a negative terminal 32. Negative terminal 32 connects electrically to metal casing 28. Positive terminal 30 projects through an opening in an electrically insulating cap 33 at the top of casing 28.

Figure 2:
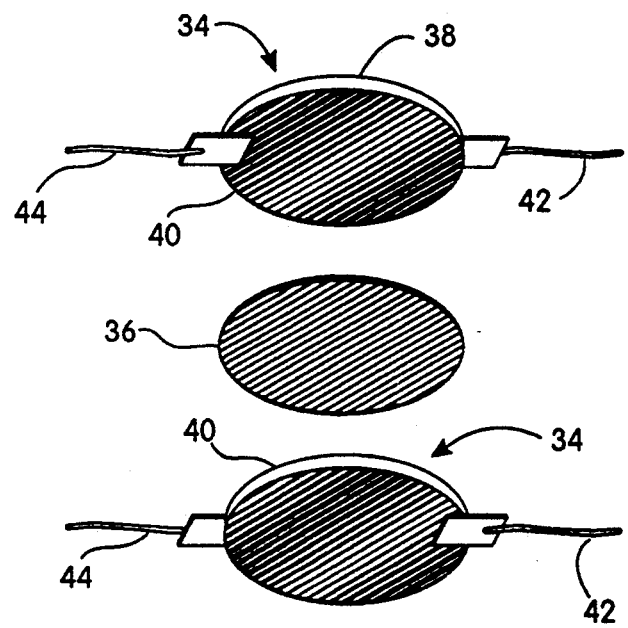
FIG. 2 is an exploded view of a single power cell of the nuclear battery of FIG. 1.
Figure 3:
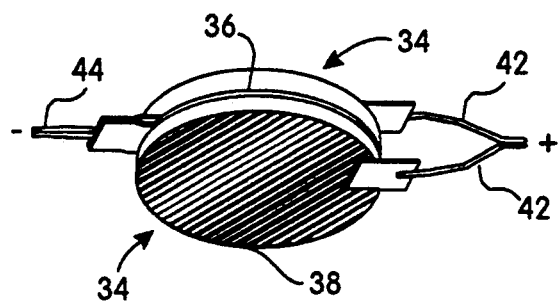
FIG. 3 is an assembled view of the power cell of FIG. 2.

As shown in FIG. 2, stack 22 is characterized by a sequence of say ten power cells of the type shown in FIGS. 2 and 3. Each power cell includes a pair of semiconductor-junction strata 34 between which is sandwiched a radionuclide emitter stratum 36. Each semiconductor-junction stratum typically ranges in thickness from 1 to 250 microns. At the lower end of this range, the semi-conductor junction stratum, in one form, is deposited on a substrate composed, for example, of silicon. Each emitter stratum typically ranges in thickness from 0.1 to 5 microns. The upper thickness limit is determined by undue self-absorption of emitted particles. Each semiconductor-junction stratum has an electrically positive face region 38 and an electrically negative face region 40. Positive face region 38 is established by subjection to a p-dopant selected, for example, from the class consisting of zinc and cadmium. Negative face region 40 is established by subjection to an n-dopant selected, for example, from the class consisting of silicon and sulfur. A lead 42 from positive face region 38 and a lead 44 from negative face region 40 connect into the remainder of the electrical system.

In one form, emitter strata 36 produce alpha particles characterized by a monoenergetic level in excess of 4.5 MeV and ranging upwardly to about 6.5 MeV and ordinarily 5 to 6.1 MeV. In another form, emitter strata 36 produce beta particles having a maximum energy level in excess of 0.01 MeV and ranging upwardly to about 3.0 MeV. Typical compositions of emitter strata 36 are selected from the class consisting of the isotopes listed in the following table, in which $E_{max}$ refers to maximum energy, $E_{avg}$ to average energy, and $T_{\frac{1}{2}}$ to half life:

| Isotope | Type of Emitter (Mev) | Maximum Energy (Mev) | Half Life Years |
|---|---|---|---|
| $H^3$ | β | 0.018 | 12.3 |
| $Ni^{63}$ | β | 0.067 | 92.0 |
| $Sr^{30}/Y^{90}$ | β | 0.545/ 2.26 | 27.7 |
| $Pm^{147}$ | β | 0.230 | 2.62 |
| $Tl^{204}$ | β | 0.765 | 3.75 |
| $Kr^{85}$ | β | 0.670 | 10.9 |
| $Pu^{238}$ | α | 5.50 | 66.4 |
| $Cm^{242}$ | α | 6.10 | 0.45 |
| $Cm^{244}$ | α | 5.80 | 18.0 |
| $Po^{210}$ | α | 5.30 | .38 |

Preferably, voltaic-junctions strata 34 are inorganic semiconductors which are binary, ternary and/or quarternary compounds of Group III and Group V elements of the Periodic Table. Preferred Group III elements are selected form the class consisting of boron, aluminum, gallium and indium. Preferred Group V elements are selected from the class consisting of phosphorous, arsenic and antimony. These compounds are typified by the class consisting of AlGaAs, GaAsP, AlInP, InAlAs, AlAsSb, AlGaInP, AlGaInAs, AlGaAsSb, InGaAs, GaAsSb, InAsP, AlGaSb, AlInSb, InGaAsP, AlGaAsSb and AlGaInSb.

Figure 4:
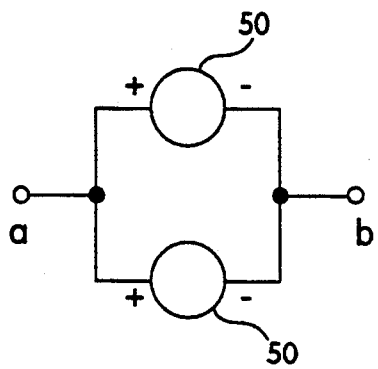
FIG. 4 illustrates a parallel assemblage of two of the power cells of FIG. 3.
Figure 5:
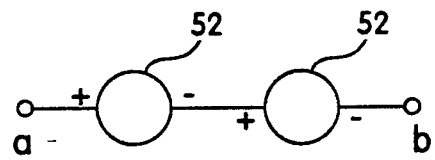
FIG. 5 illustrates a series assemblage of two of the power cells of FIG. 3.
Figure 6:
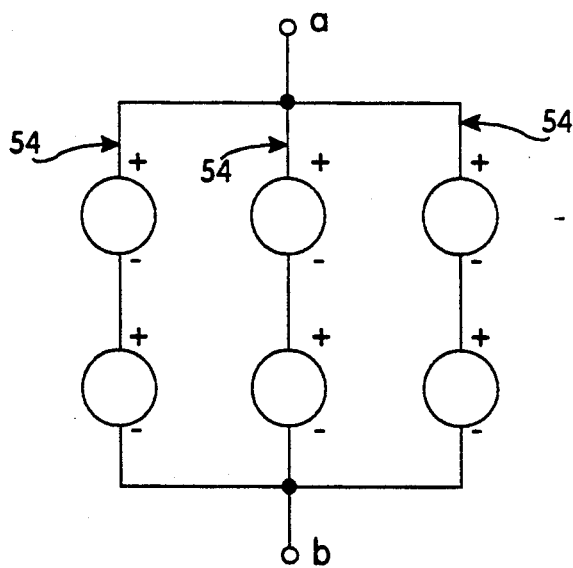
FIG. 6 illustrates a configuration of three parallel strings of the power cells of FIG. 3, each string having two power cells in series.
Figure 7:
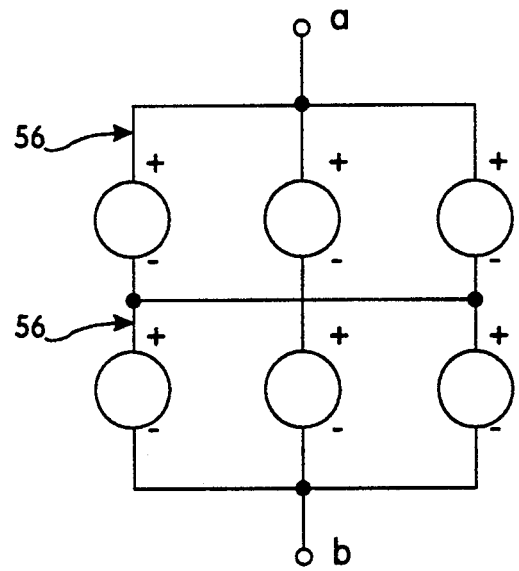
FIG. 7 illustrates two submodules in series, each submodule having three cells in parallel.

Equivalent circuits of various embodiments of the battery of FIGS. 1 to 3 are shown in FIGS. 4 to 7. These embodiments are illustrated as schematics in which various series and parallel combinations achieve a range of output currents and voltages. In FIG. 4, a plurality of cells 50 are arranged in parallel to produce relatively high current. In FIG. 5, a plurality of cells 52 are arranged in series to produce relatively high voltage. FIG. 7 shows a plurality of parallel strings of cells 54, each string having a plurality of cells in series. FIG. 8 shows a plurality of submodules 56 in series, each submodule having a plurality of cells in parallel.

EXAMPLE

The present invention is specifically illustrated by a configuration of the cell of FIGS. 1, 2 and 3 in which voltaic junction 34 is an indium phosphide stratum, opposite face regions of which are implanted with (1) zinc ions to establish a p-region and (2) silicon ions to establish an n-region. Each voltaic-junction stratum is approximately 150 microns thick. In one version of this example, emitter stratum is composed of Pu-238. In another version of this example, the emitter stratum is composed of Sr-90. Each emitter stratum is approximately 1.5 microns in thickness. Radiation shielding enclosure 24 is composed of tantalum. Thermal insulating enclosure 26 is composed of ceramic. The thickness and composition of insulating enclosure 26 is selected to maintain the temperature of stack 22 at 50° C. in an environment where the temperature is no greater than approximately 20° C., i.e. (1) for space applications in which the cell is shielded from heating by solar radiation, or (2) no greater than 35° C., i.e., for terrestrial applications in which the cell operates at room or body temperature. The indium phosphide anneals most of its radiation damage at temperatures below 100° C.

OPERATION AND CONCLUSIONS

The present invention contemplates semiconductors with three unique features (1) relatively high radiation resistance, (2) continued photovoltaic function at elevated temperatures, and (3) real time annealing of radiation damage in the same temperature range. These features support a high energy density radio-nuclide battery operating with relatively high energy beta and/or alpha particle sources. The design of these batteries takes into consideration the rapidity of annealing of radiation damage in InP when irradiated at 100° C., continued operation during annealing, and tolerance of different intensities of alpha and beta radiation for different applications. Annealing at elevated temperature supports a large dose rate with minimal degradation in power output. These properties make it possible to consider a much wider range of radioisotopes than has been possible with silicon betavoltaic cells.

Since most previously developed silicon-based beta voltaic cells have used Pm-147, this nuclide serves as a good basis for comparison of prior art batteries with batteries of the present invention. Pm-147 emits beta particles with a peak energy of 0.23 MeV, average energy of 0.063 MeV, and half-life of 2.62 years. Promethium cells generally provide a maximum power of 1000 $\mu W/cm^3$ which drops to 266 $\mu W/cm^3$ after 5 years. At least 1.5 $Ci/cm^2$ has been required to produce 50 $\mu W/cm^2$.

To illustrate the advantage provided by InP, the Pm-147 silicon cell is compared below in Table 2 with other beta isotopes and an alpha emitter. In Table 2, T refers to half-life, $E_{max}$ refers to maximum energy, $Ci/cm^2$ refers to curies per square centimeter, BOL refers to "Beginning Of Life", EOL refers to "End Of Life", W refers to watts and h refers to hours.

| Isotope | $T_{\frac{1}{2}}$ Years | $E_{max}$ MeV | Activity $Ci/cm^2$ | Output (5 years) | | |
|---|---|---|---|---|---|---|
| | | | | BOL $W/cm^3$ | EOL $W/cm^3$ | Total $W-h/cm^3$ |
| Pm-147 | 2.62 | 0.230 | 1.50 | 1000 | 266 | 24.3 |
| Tl-204 | 3.75 | 0.765 | 1.05 | 672 | 266 | 19.2 |
| Sr-90 | 27.7 | 0.545 | 0.19 | 301 | 266 | 13.3 |
| Pu-238 | 86.4 | 5.5 | 0.004 | 276 | 266 | 11.9 |

The activity level for each of the above isotopes was adjusted to give the same End Of Life power density as Pm-147. This means that the longer lived isotopes require a much smaller activity level to achieve the same End Of Life power level. We note that total energy output of the Pu-238 powered cell at the end of twenty years is calculated to be 44.7 $W-h/cm^3$ and its power density 235 $W-h/cm^3$. After 20 years, the Pm-147 cell is calculated to generate just 33.0 $W-h/cm^2$ and its power density is calculated to be 5.04 $\mu Wcm^3$.

Another method of comparison is by lifetimes, assuming that the same average power is produced. Table 3 below compares the power output half-life for four cases, all starting at 1 $mW/cm^3$ and generating an average power of 722 $\mu W/cm^3$.

|  | Best Chemical Batteries |  |
|---|---|---|
| Hg-Zn | (chemical battery) 0.55 W-h/cm$^3$ | 1 Month |
|  | Best Betavoltaic - Si |  |
| Pm$^{147}$-Si | 16.6 W-h/cm$^3$ | 2.6 Years |
|  | InP at Room Temp (No Anneal) |  |
| Sr$^{90}$/Y$^{90}$-InP | 182 W-h/cm$^3$ | 28 Years |
|  | InP with Anneal |  |
| Pu$^{238}$-InP | 544 W-H/cm$^3$ | 86 Years |

It is to be noted that even without annealing, the higher energy output of Sr-90 is far superior to previous configurations based on Si junctions, even ignoring emissions of the daughter nuclide, Y-90, which would also contribute. Annealing during operation allows an alpha source, such as Pu-238, to provide enormous operating times. The present invention anticipates that a nuclide with an extended alpha emitting decay chain (Ra-226) actually may increase power output as it ages. It is coincidence in this comparison, that the long lived materials actually use less radioactive material, in curies (Ci) or becquerel (Bq), than Pm-147. The number of curies required to provide a given power level is directly related to lifetime and inversely related to average energy of the emitted particles.

Thus:
for Pm-147, the activity is 1.5 Ci/cm$^2$;
for Sr-90, the activity is 0.63 Ci/cm$^2$; and
for Pu-238, the activity is 0.017 Ci/cm$^2$.

It is found that damage effectiveness of electrons drops rapidly with energy below 1 MeV and, for a pure Sr-90 beta spectrum, is estimated to be 1.2% of that for 1 MeV electrons. Tests have established that $10^{16}$/cm$^2$ of 1 MeV electrons drop InP cell efficiency to 80% of its initial value at room temperature. Considering the spread of energies in a Sr-90 beta spectrum, there is a requirement for an exposure of $10^{18}$ Sr-90 beta particles to produce the same effect as a 1 MeV electron beam.

For 0.667 curies/cm$^2$ of Sr-90 and again neglecting the daughter emissions, approximately $2.47 \times 10^{10}$ electrons/cm$^2$/sec penetrate one face of the InP stratum. Since activity is sandwiched between two cells, actual curies/cm$^2$ is 1.33 Ci from which $2.47 \times 10^{10}$/sec follows. Exposure time required to reach a fluence of $10^{18}$ is estimated at $4.05 \times 10^7$ seconds, $1.125 \times 10^4$ hours, or 1.28 years. An electron beam of 10 $\mu$A/cm$^2$ delivers a fluence of $10^{16}$/cm$^2$ in 2.67 minutes so that test irradiation takes no longer than an hour.

Efficiency of isotope powered cells is the fraction of particle energy converted to electrical energy. For Pm-147 powered silicon cells, it has been found that $5.55 \times 10^{10}$ beta particles per square centimeter per second yielded a power output of 25 $\mu$W/cm$^2$. For Pm-147 beta particles with an average energy of 0.0625 MeV the input power is 555 $\mu$W/cm$^2$. The total efficiency achieved in this case is 4.5%. The theoretical efficiency achievable has been calculated as greater than 10%.

High energy particles, such as alpha particles from Pu-238, will displace atoms from their normal bound positions in a crystalline semiconductor, such as indium phosphide. The number of atoms displaced depends upon the energy and mass of the incident particle, the mass of the target atoms, and the minimum energy required to remove it from its bound lattice position. A displaced atom can have considerable recoil energy immediately after being struck by the incident particles. The excess energy is dissipated by ionizing and displacing adjacent atoms in the crystal lattice until the primary recoil energy has dropped to thermal energies (0.025 eV at room temperature). The end result is a number of vacant lattice sites (vacancies) and displaced atoms in interstitual positions in the lattice (interstitials).

At room temperature (300° K.) the vacancies and interstitials are mobile, and diffuse through the crystal lattice until they interact with other defects or lattice impurities, or reach the surface, or annihilate. Many of the complex defects that result from these interactions are stable at room temperature and introduce energy levels throughout the forbidden gap of the semiconductor. The defect energy levels can reduce the lifetime of minority carriers, the majority carrier concentration, and the mobility of the majority carriers. All of these properties have a major impact on the operation of a device such as a solar cell.

Each semiconductor material exposed to the same radiation develops a spectrum of radiation defects that are unique to that material. In addition, for a given material, the spectrum of defects observed is a strong function of the temperature at which the material is irradiated. At sufficiently low temperatures, the primary vacancies and interstitials can be "frozen in", and the changes in semiconductor properties associated with them studied as the semiconductor is warmed to room temperature and above. At sufficiently high temperatures, the material can be restored to its original state. Note that in semiconductors such as silicon the temperature required to restore the original properties is so high that it would destroy any device composed of the material. At such a temperature, impurities deliberately implanted in certain regions of the device to form p-n junctions diffuse throughout the material, and metal contacts are destroyed, thereby rendering the device useless. In accordance with the present invention, III-V compounds like indium phosphide are unique in that a large fraction of the radiation induced defects anneal at fairly low temperatures, in the case of indium phosphide, below 100° C. The integrity of such devices therefore are maintained.

The major factor governing the ability of a material to anneal damage is traceable to the stability of the complex defects formed under irradiation. Whether a semiconductor will anneal radiation induced damage at low temperatures or not has to be determined by experiment. No single property or combination of properties has been identified as being responsible for such behavior.

In the case of indium phosphide, experiments have shown that the net defect density introduced by energetic particles is much less than in the case of common semiconductors such as silicon and gallium arsenide. The latter semiconductors, when irradiated at room temperature, form defects which are stable and which markedly affect their properties. Semiconductors that exhibit annealing behavior at particular temperatures can be determined only by experiment. Factors such as energy gap, threshold energy for displacement, diffusion coefficient, and defect mobility are not sufficient to identify a likely material.

What is claimed is:
1. An electric battery comprising:
 (a) a semiconductor junction incorporating an inorganic crystalline compound of Group III and Group V elements of the Periodic Table character- ized by a predetermined annealing temperature for defects therein;

(b) a nuclear source of relatively high energy radiation and concomitant heat, said radiation causing generation of said defects in said semiconductor junction; and (c) a thermal impedance enclosure for said nuclear source and said semiconductor-junction for retaining therewithin a sufficient quantity of heat generated by said nuclear source to maintain a functional relationship between said generation of defects and said predetermined annealing temperature during operation;

(d) said semiconductor junction characterized by a radiation damage threshold;

(e) said nuclear source being radionuclide selected from the class consisting of alpha, gamma and beta emitters;

(f) said nuclear source being a radionuclide having a relatively high energy above said radiation damage threshold;

(g) said normal operating temperature within said thermal impedance enclosure being at least as great as said predetermined annealing temperature.

2. The electric battery of claim 1, wherein said nuclear source is a beta emitter.

3. The electric battery of claim 1, wherein said nuclear source is an alpha emitter.

4. The electric battery of claim 1 wherein said Group III elements are selected from the class consisting of boron, aluminium, gallium and indium.

5. The electric battery of claim 1 wherein said Group V elements are selected from the class consisting of phosphorous, arsenic and antimony.

6. The electric battery of claim 1 wherein the normal operating temperature within said thermal impedance enclosure is at least as great as 50° C.

7. The electric battery of claim 1 wherein said semiconductor-junction is a stratum, one surface of which is characterized by a p-dopant and the other surface of which is characterized by an n-dopant.

8. The electric battery of claim 7 wherein said p-dopant is selected from the class consisting of zinc and cadmium, and said n-dopant is selected from the class consisting of silicon and sulfur.

9. The electric battery of claim 1, wherein said semiconductor junction contains indium phosphide.

10. An electric battery comprising:

(a) a stack of power cells including radionuclide emitter strata and voltaic junction strata;

(b) said radionuclide emitter strata constituting a nuclear source of relatively high energy radiation and hat;

(c) said voltaic junction strata being composed of semiconductor compounds of Group III and Group V elements of the periodic table subject to generation of mobile defects therein characterized by a predetermined annealing temperature;

(d) a thermal impedance enclosure for said stack for retaining therewithin a sufficient quantity of heat generated by said nuclear source to maintain said semiconductor junction strata above said predetermined annealing temperature during operation;

(e) said semiconductor junction strata being characterized at their opposite surfaces by p-regions and n-regions, positive conductor terminals being operatively connected to said p-regions, negative conductor terminals being operatively connected to said n-regions;

(f) said positive conductor terminals and said negative conductor terminals being accessible externally of said thermal impedance enclosure.

(g) said semiconductor junction being characterized by a radiation semiconductor threshold (h) said nuclear source being a radionuclide selected from the class consisting of alpha, beta, and gamma emitters;

(i) said nuclear source being a radionuclide having a relatively high energy above said radiation damage threshold;

(j) said normal operating temperature within said thermal impedance enclosure is at least as great as said predetermined annealing temperature.

11. The electric battery of claim 10, wherein said nuclear source is a an alpha emitter.

12. The electric battery of claim 10 wherein said nuclear source is a beta emitter.

13. The electric battery of claim 10 wherein said source is a gamma emitter.

14. The electric battery of claim 10 wherein said Group III elements are selected from the class consisting of boron, aluminium, gallium and indium.

15. The electric battery of claim 10 wherein said Group V elements are selected from the class consisting of phosphorous, arsenic and antimony.

16. The electric battery of claim 10 wherein the normal operating temperature within said thermal impedance enclosure is at least as great as 50° C.

17. The electric battery of claim 1 wherein said semiconductor strata have opposed faces characterized by a p-dopant and an n-dopant.

18. The electric battery of claim 17 wherein said p-dopant is selected from the class consisting of zinc and cadmium, and said n-dopant is selected from the class consisting of silicon and sulfur.

19. The electric battery of claim 1 wherein said semiconductor junction contains indium phosphide as its characteristic ingredient.

* * * * *